United States Patent [19]
Kawasaki

[11] 3,947,766
[45] Mar. 30, 1976

[54] COMBINED TRANSCEIVER AND RADIO UNIT

[75] Inventor: Kazuo Kawasaki, Kitakata, Japan

[73] Assignee: Nissan Denshi Kabushikigaisha, Japan

[22] Filed: Dec. 16, 1974

[21] Appl. No.: 533,004

[52] U.S. Cl. ............... 325/25; 74/10.45; 74/10.8; 325/302; 334/2
[51] Int. Cl.² ................... H03J 5/00; H04B 1/40
[58] Field of Search ......... 325/15, 16, 25, 111, 117, 325/119, 301, 302, 303, 312, 452, 457; 334/1, 2; 74/10.27, 10.45, 10.8

[56] References Cited
UNITED STATES PATENTS
2,773,390  12/1956  Oeler ............................. 74/10.45
3,447,088  5/1969  Guyton et al. .................. 325/458

*Primary Examiner*—Robert L. Griffin
*Assistant Examiner*—Marc E. Bookbinder
*Attorney, Agent, or Firm*—McGlew and Tuttle

[57] ABSTRACT

The unit incorporates a transceiver, having a channel changing mechanism, and a radio, having a radio tuner, enclosed in a common housing for conjoint mounting. A transceiver control shaft has an inner end in operative connection with the channel changing mechanism and an outer end having a first gear secured thereto. A tubular outer shaft extends through an opening in the front wall of the housing and has a second gear secured to its inner end. An inner shaft extends coaxially through the tubular shaft, and respective control knobs are secured to the outer ends of the tubular shaft and the inner shaft. A pair of levers have their inner ends interconnected by a pivot and their outer ends respectively pivoted on the transceiver control shaft and tubular shaft, and an idler gear is freely rotatable on the pivot and meshes with the first and second gears to constitute a driving connection therebetween. The tubular outer shaft extends through an elongated slot in the front wall of the housing, and the inner end of the inner shaft is connected by one or more universal joints to the radio tuner.

3 Claims, 4 Drawing Figures

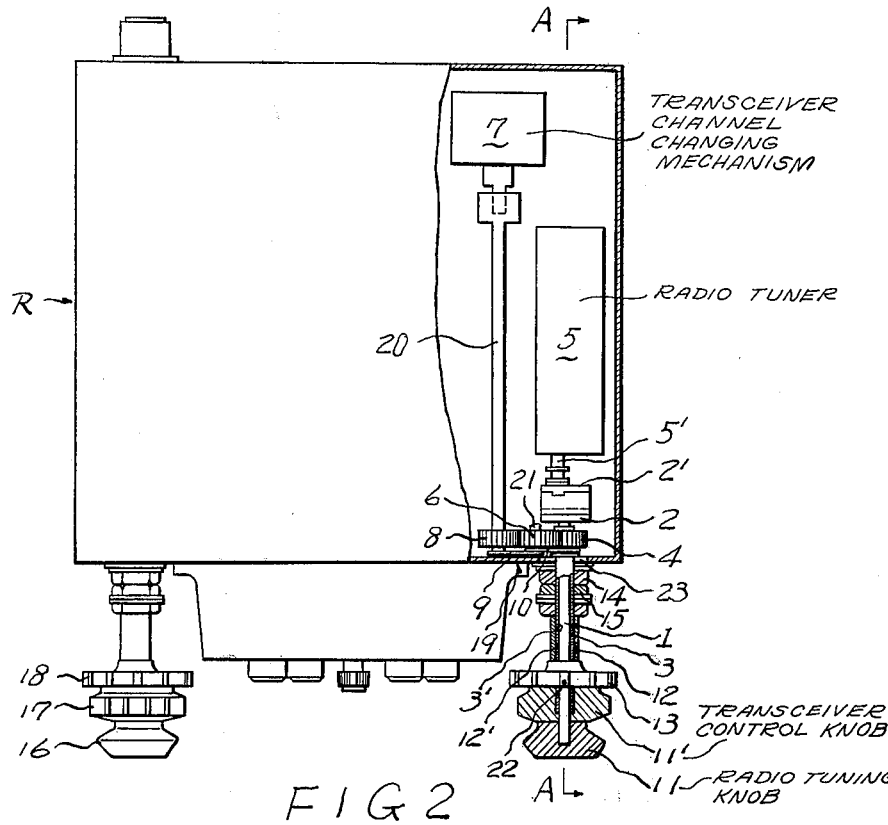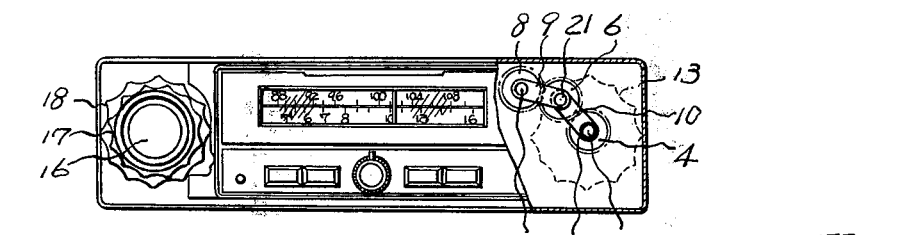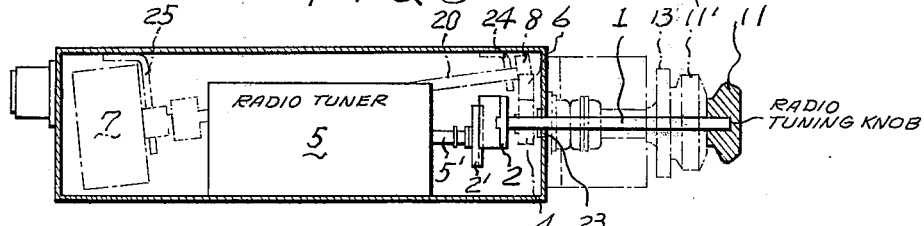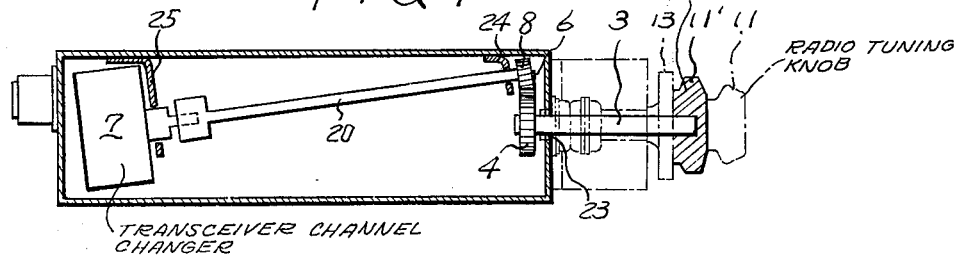

COMBINED TRANSCEIVER AND RADIO UNIT

FIELD AND BACKGROUND OF THE INVENTION

This invention relates to a combined transceiver and radio unit. Nowadays, various kinds of transceivers are widely used as a radiotelephone between different or remote places, since they include both transmitting and receiving means therein.

Heretobefore, where used in a car for example, they have been mounted on any suitable place such as on or below the dashboard in the driver's compartment, separately from radio set.

SUMMARY OF THE INVENTION

An object of the invention is to provide a combined transceiver and radio unit including a transceiver control shaft in operative connection with a channel changing mechanism of the transceiver, and having a first gear at its outer end, a tubular outer shaft extending through a front wakl of a common housing and having a second gear on its inner end, and an inner shaft extending coaxially through the tubular shaft and in operative connection with a radio tuner of the radio, the tubular shaft and the inner shafts having respective control knobs on their outer ends, with the first and second gears being in driving connection with each other.

Another object of this invention is to provide a new transceiver and radio unit which further comprises a free or idler gear interposed between the above two gears in order to enable the coaxial shafts to be shifted relatively to the fixedly rotated transceiver control shaft, the free gear being mounted on the hinge portion of pivotably connected levers. The other ends of these levers are connected to the transceiver control shaft and the outer shaft respectively, and a universal joint or joints are interposed between the radio tuner and the inner shaft in order to effect virtual alignment of the inner shaft and the radio tuner.

Other objects and advantages of this invention will be apparent from the following description of preferred embodiments of this invention made with reference to the accompanying drawings.

BRIEF DESCRIPTION OF THE DRAWINGS

In the accompanying drawings,

FIG. 1 is a plan view of a combined transceiver and radio unit constituting an illustrative embodiment of the present invention, the view being partly in section.

FIG. 2 is a front elevational view of the unit, the view being partly in section and certain parts being broken away.

FIG. 3 and 4 are transverse sectional view taken generally along a line A—A in FIG. 1, certain parts being selectively broken away in order to show respective parts separately from each other.

DESCRIPTION OF THE PREFERRED EMBODIMENT

As shown, the transceiver and radio unit R has coaxial control knobs 11 and 11'. The knob 11 is the radio tuning control, while the knob 11' is the transceiver control. It will be seen that the knobs 11 and 11' are mounted on respective coaxial shafts 1 and 3. The shaft 1 extends through a bore 3' in the shaft 3. Thus, the transceiver control shaft 3 is freely rotatable about the radio tuning shaft 1.

The radio tuning shaft 1 extends through the front wall 19 and connects at the upper inner end thereof to radio tuner 5 through universal joints 2 and 2' and tuner shaft 5', as shown in FIGS. 1 and 3. The transceiver control shaft 3 also extends through a bore 12' in a bushing 12 so that, the transceiver control shaft 3 is freely rotatable within the bushing 12. It also extends through the front wall 19 and connects, through gear 4 fixed at the inner end thereof, free gear 6 as shown in FIG. 2, and a third gear 8 fixed on the end of a rod 20, to the transceiver channel changing mechanism 7.

The gears 4 and 6 are rotatably supported by a lever 10 and constantly engage with each other. Likewise, the gears 6 and 8 are rotatably supported by a second lever 9 and constantly engage with each other. The levers 9 and 10, the inner ends of which are hingedly connected, are pivotable at the inner ends on pivot 21. The rod 20, with the gear 8 on the end thereof is journaled by brackets 24 and 25. Thus, gear 4 supported on the outer end of the lever 10 can move away from and near to the gear 8 supported on the outer end of the lever 9 through the pivotable levers 9 and 10, when the control shafts 1 and 3 are eventually displaced along a longitudinal slot 23 formed in the front wall 19.

A non-rotatable imitation knob 13 is fixed on the outer end of bushing 12' and a fitting adapter is secured by a fastening nut to guide the outer tubular shaft 3. At the left side of the unit, as viewed in FIGS. 1 and 2, there are provided a power switch and volume control knob 16, a tone control knob 17 and a balance control knob 18, in a known manner. The fixed imitation knob 13 may be provided with an indication 22, such as an asterisk.

Since the present invention is constructed as above, when the radio tuning knob 11 is turned, the inner shaft, viz. the radio tuning shaft 1 is turned and, through the universal joints 2 and 2', controls the radio tuner 5. Likewise, when the transceiver control knob 11' is turned, the outer shaft, viz. the transceiver control shaft 3 is turned and consequently the gear 4 is turned. Turning of the gear 4 is transmitted through the free or idler gear 6 to the gear 8 which, in turn, actuates the transceiver channel changing mechanism 7 through the rod 20 journaled by the brackets 24 and 25.

By employment of the universal joints 2 and 2', between the radio tuning shaft 1 and the tuner shaft 5', turning of the radio turning knob 11 and shaft 1 can be smoothly transmitted to the radio tuner 5 even when said shafts 1 and 5' are not aligned. This permits the inner and outer shafts 1 and 3 to be advantageously located at any desired place along the longitudinal slot 23 formed in the front wall 19.

Though this invention has been hereinbefore described with reference to the preferred embodiment illustrated in the drawings, the interposed free gear 6 and the universal joints 2 and 2' can of course be omitted in the case where the shafts 1 and 3 are extended through predetermined, definite, or limited hole in the front wall 19.

Otherwise, various other modifications, alternative constructions and equivalents may be employed without departing from the true spirit and scope of the invention, as exemplified in the foregoing description and defined in the following claims.

What is claimed is:

1. A combined transceiver and radio unit, incorporating a transceiver, having a channel changing mechanism, and a radio, having a radio tuner, enclosed in a common housing, having a front wall, for conjoint mounting, said unit comprising, in combination, a transceiver control shaft, having an inner end in operative connection with said channel changing mechanism, and an outer end; a first gear secured to said outer end of said control shaft; a tubular outer shaft extending through an opening in said front wall, and having inner and outer ends; a second gear secured to the inner end of said outer shaft and in driving connection with said first gear; an inner shaft, extending coaxially through said tubular shaft, having an inner end in operative connection with said radio tuner, and an outer end; respective control knobs secured to the outer ends of said outer and inner shafts; a pair of levers having inner ends interconnected by a pivot and outer ends respectively pivoted on said transceiver control shaft and said outer shaft; and an idler gear freely rotatable on said pivot and meshing with said first and second gears to constitute said driving connection therebetween; said levers and said idler gear providing for relative displacement of said tubular outer shaft relative to said transceiver control shaft.

2. A combined transceiver and radio unit, as claimed in claim 1, including universal joint means constituting the operative connection between said inner shaft and said radio tuner.

3. A combined transceiver and radio unit, as claimed in claim 2, in which said universal joint means comprises two universal joints in series with each other.

* * * * *